United States Patent
Briere

(10) Patent No.: US 9,673,286 B2
(45) Date of Patent: Jun. 6, 2017

(54) GROUP III-V TRANSISTOR WITH SEMICONDUCTOR FIELD PLATE

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 0 days.

(21) Appl. No.: 14/531,181

(22) Filed: Nov. 3, 2014

(65) Prior Publication Data

US 2015/0155358 A1 Jun. 4, 2015

Related U.S. Application Data

(60) Provisional application No. 61/910,522, filed on Dec. 2, 2013.

(51) Int. Cl.
| H01L 29/78 | (2006.01) |
| H01L 29/40 | (2006.01) |

(Continued)

(52) U.S. Cl.
CPC ........ *H01L 29/405* (2013.01); *H01L 29/2003* (2013.01); *H01L 29/7786* (2013.01); *H01L 29/7787* (2013.01)

(58) Field of Classification Search
CPC ......... H01L 29/66431; H01L 29/66462; H01L 2924/13064; H01L 29/778; H01L 29/7781; H01L 29/7782; H01L 29/7786

See application file for complete search history.

(56) References Cited

U.S. PATENT DOCUMENTS

| 6,525,389 B1 | 2/2003 | Ahmed |
| 6,617,060 B2 | 9/2003 | Weeks |

(Continued)

FOREIGN PATENT DOCUMENTS

| JP | 2004214471 A | 7/2004 |
| JP | 2007048866 A * | 2/2007 |
| JP | EP1901342 A1 | 3/2008 |

OTHER PUBLICATIONS

Saito et al., Nitride Semiconductor Element, Feb. 2007, Jp 2007048866 A, English Translation by EPO and Google.*

(Continued)

*Primary Examiner* — Earl Taylor
*Assistant Examiner* — Samuel Park
(74) *Attorney, Agent, or Firm* — Murphy, Bilak & Homiller, PLLC

(57) ABSTRACT

There are disclosed herein various implementations of a group III-V transistor with a semiconductor field plate. Such a group III-V transistor includes a group III-V heterostructure situated over a substrate and configured to produce a two-dimensional electron gas (2DEG). In addition, the group III-V transistor includes a source electrode, a drain electrode, and a gate situated over the group heterostructure. The group III-V transistor also includes an insulator layer over the group III-V heterostructure and situated between the gate and the drain electrode, and a semiconductor field plate situated between the gate and the drain electrode, over the insulator layer.

12 Claims, 4 Drawing Sheets

(51) Int. Cl.
*H01L 29/778* (2006.01)
*H01L 29/20* (2006.01)

(56) References Cited

U.S. PATENT DOCUMENTS

| | | | |
|---|---|---|---|
| 6,649,287 B2 | 11/2003 | Weeks | |
| 7,339,205 B2 | 3/2008 | Piner | |
| 8,344,417 B2 | 1/2013 | Weeks | |
| 8,592,862 B2 | 11/2013 | Weeks | |
| 8,659,030 B2 | 2/2014 | Briere | |
| 2006/0145189 A1 | 7/2006 | Beach | |
| 2007/0029617 A1* | 2/2007 | Kato | 257/367 |
| 2007/0056506 A1 | 3/2007 | Bridger | |
| 2009/0230429 A1* | 9/2009 | Miyamoto | H01L 29/402 257/192 |
| 2010/0270559 A1* | 10/2010 | Ota | H01L 29/7787 257/76 |
| 2012/0074426 A1* | 3/2012 | Ohki et al. | 257/76 |
| 2012/0153351 A1 | 6/2012 | Chandolu | |
| 2012/0205667 A1* | 8/2012 | Simin | H01L 29/7786 257/77 |
| 2012/0223365 A1 | 9/2012 | Briere | |
| 2012/0280363 A1 | 11/2012 | Sumida | |
| 2013/0056753 A1 | 3/2013 | Simin | |
| 2013/0077352 A1* | 3/2013 | Shimizu et al. | 363/17 |
| 2013/0105817 A1* | 5/2013 | Saunier | H01L 29/778 257/77 |
| 2013/0126942 A1 | 5/2013 | Nakajima | |

OTHER PUBLICATIONS

Mishra et al., "GaN-Based RF Power Devices and Amplifiers", Feb. 2008, Proceedings of the IEEE, vol. 96 Issue 2, pp. 287-305.*
Extended European Search Report dated May 6, 2015 for European Patent Application No. 14193796.1.
U.S. Appl. No. 61/910,522, filed Dec. 2, 2013, Briere.
"POWDEC Soon to Realize Breakthrough GaN Power Transistor" POWDEC KK., www.powdec.co.jp Oct. 3, 2013.
"POWDEC Announces Breakthrough GaN Transistor Design" Jessie Shen, DIGITIMES Mar. 28, 2011.

* cited by examiner

GROUP III-V TRANSISTOR WITH SEMICONDUCTOR FIELD PLATE

The present application claims the benefit of and priority to a provisional application entitled "III-Nitride Transistor with Semiconductive Field Plate," Ser. No. 61/910,522 filed on Dec. 2, 2013. The disclosure in this provisional application is hereby incorporated fully by reference into the present application.

BACKGROUND

Definition

As used herein, the phrase "group III-V" refers to a compound semiconductor including at least one group III element and at least one group V element. By way of example, a group III-V semiconductor may take the form of a III-Nitride semiconductor. "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascade with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

BACKGROUND ART

Group III-V heterostructure field-effect transistors (HFETs), such as gallium nitride (GaN) or other III-Nitride based high mobility electron transistors (HEMTs), may be desirable for use as power transistors in high performance circuit applications due to their high efficiency and high-voltage capability. III-Nitride and other group III-V HEMTs operate using polarization fields to generate a two-dimensional electron gas (2DEG) allowing for high current densities with low resistive losses.

As the voltage requirements for these power transistors continue to increase, various techniques have been employed to improve their voltage breakdown characteristics. For example, field plate structures may be utilized to shape the electric field in the high-field region of the transistor. Although conventional field plate implementations can improve resistance to breakdown in many applications, new solutions providing reduced peak electric fields for improved transistor breakdown capability and robust, long term reliability in higher voltage applications are needed.

SUMMARY

The present disclosure is directed to a group III-V transistor with semiconductor field plate, substantially as shown in and/or described in connection with at least one of the figures, and as set forth more completely in the claims.

DETAILED DESCRIPTION

Figure 1:
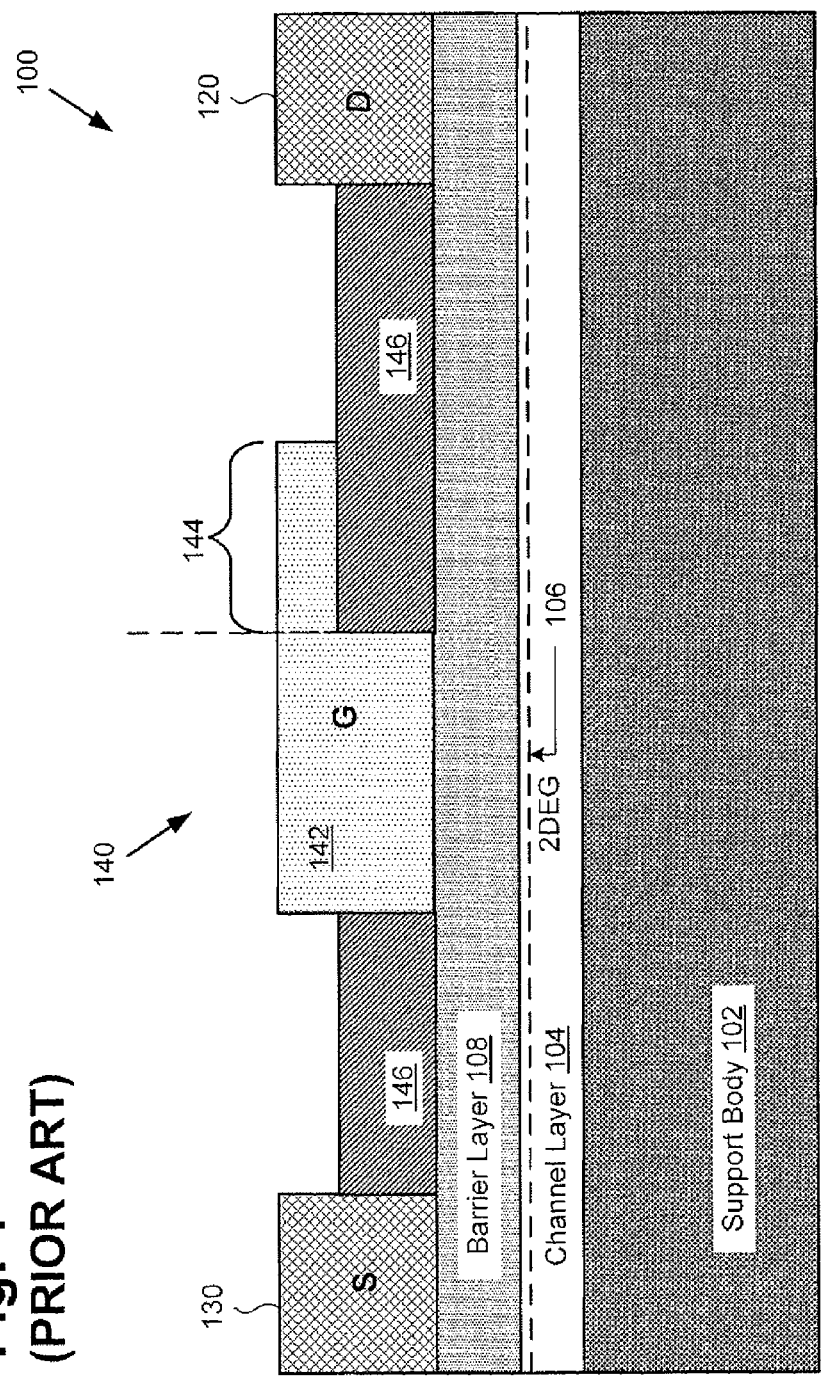
FIG. 1 shows a cross-sectional view of a conventional high electron mobility transistor (HEMT) with a field plate.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of a conventional high electron mobility transistor (HEMT) with a field plate. HEMT 100 includes support body 102, channel layer 104, barrier layer 108 overlying channel layer 104, surface dielectric 146, drain electrode 120, source electrode 130, and gate 140. As shown in FIG. 1, gate 140 includes gate electrode 142, and conductive field plate 144 extending over surface dielectric 146. As further shown in FIG. 1, in its conducting or "on" state, HEMT 100 includes two-dimensional electron gas (2DEG) 106, under the gate region, providing a channel for the charge carrier conduction of HEMT 100.

As noted above, the voltage requirements for power transistors, such as HEMT 100, continue to increase, requiring strategies for improving their voltage breakdown characteristics. For example, and as shown in FIG. 1, conductive field plate 144 may be utilized to shape the electric field in the high-field region of HEMT 100 adjacent gate 140. According to the conventional implementation shown in FIG. 1, conductive field plate 144 can be integrated with gate 140 and can be formed as an extension of gate electrode 142. In such an implementation, conductive field plate 144 may be formed of the same conductive material used to form gate electrode 142, such as a gate metal. As further shown in FIG. 1, conductive field plate 144 is typically formed over dielectric 146 in order to further improve the voltage breakdown capability of HEMT 100.

One drawback of conventional field plate techniques utilizing highly conductive, usually metallic, films is that, due to of their high conductivity, such films cannot support a substantial electric field across them. This results in at least two effects which impact the electric fields of the resulting structure. The first is that the potential present at a terminal which is effectively in contact with the field plate, e.g., gate or source electrode, is also present at the end of the field plate, nearest the other device terminal, e.g., drain electrode. This results in a large electric field present between the end of the field plate and, for example, the drain terminal, thereby producing a large field across insulating and semiconducting layers which are present between the two terminals. Secondly, the abrupt geometric termination of the field plate, even at a stepped edge, presents a high discontinuity to the potential across the underlying semiconductive or insulating layers situated between, for example, the gate and drain electrodes. Such discontinuities result in large peak electric fields which may be large enough to degrade the dielectric integrity of those semiconductive or insulating layers, resulting in device leakage currents, device breakdown or long term reliability degradation.

As an alternative field plate design also presently known in the art but not shown in FIG. 1, a field plate may be formed using an ultra resistive material as disclosed in U.S. patent application Ser. No. 11/322,923, entitled "III-Nitride Power Semiconductor with a Field Relaxation Feature," filed on Dec. 30, 2005, and published as U.S. Patent Application Publication Number 2006/0145189 on Jul. 6, 2006. This patent application is hereby incorporated fully by reference into the present application.

In certain other known techniques, previously used in, for instance, silicon based devices, also not shown in FIG. 1, a field plate may be formed using an amorphous silicon layer. An example of the use of amorphous silicon is found in U.S. Pat. No. 6,525,389, entitled "High Voltage Termination with Amorphous Silicon Layer Below the Field Plate", filed on Feb. 22, 2000, and issued on Feb. 25, 2003. This patent is hereby incorporated fully by reference into the present application. According to this approach, a thin layer of high resistivity amorphous silicon is deposited to evenly distribute the electric field across the termination structure. Such an approach can result in a stable field termination structure and may improve yield for some applications. However, for group III-V HEMTs, use of amorphous silicon in such manner is expected to be ineffective because the breakdown field strength of amorphous silicon is typically less than the breakdown field strength of III-Nitride and other group III-V materials.

Figure 2:
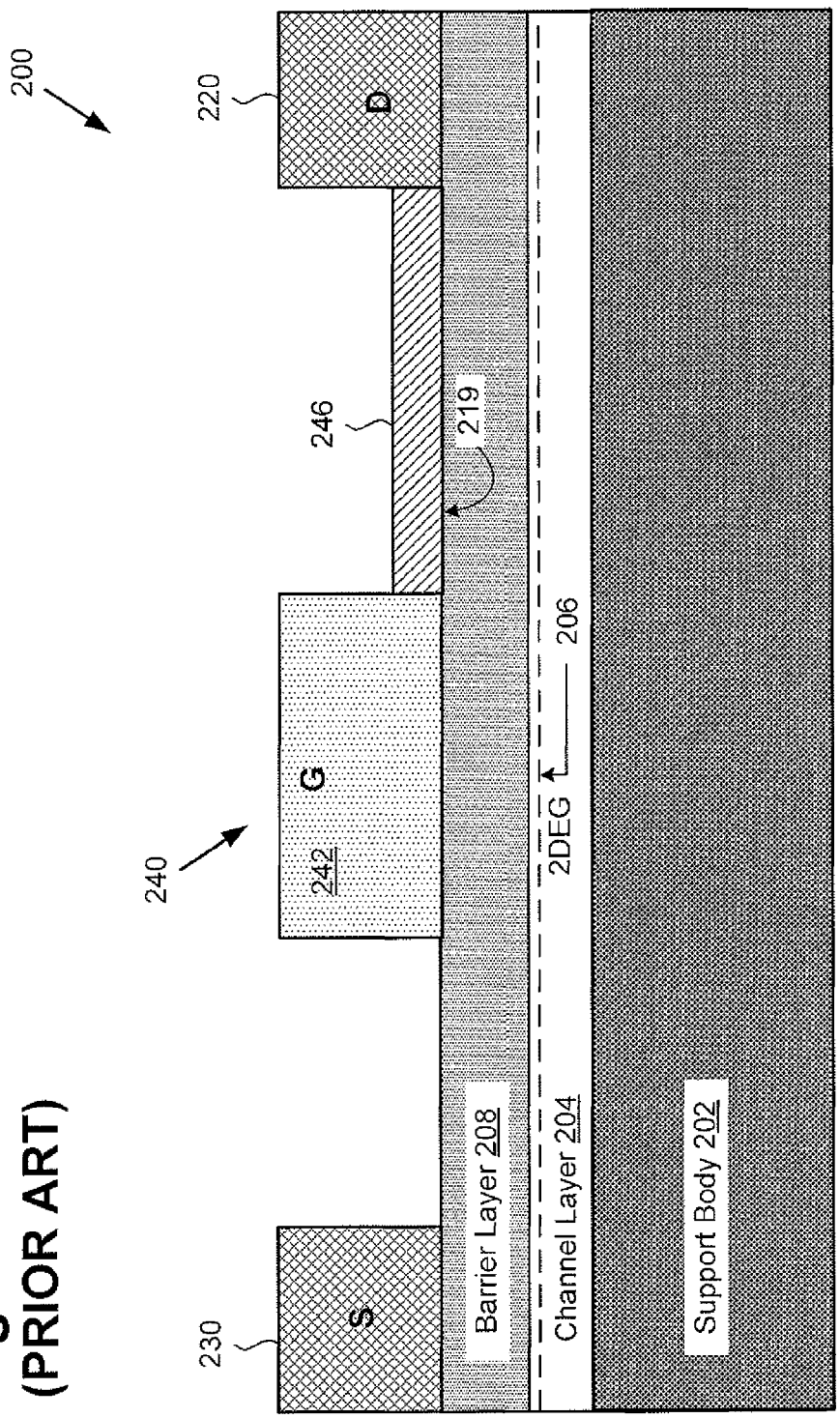
FIG. 2 shows a cross-sectional view of another conventional HEMT with a field plate.

Referring to FIG. 2, FIG. 2 shows a cross-sectional view of another conventional HEMT with a field plate. HEMT 200 includes support body 202, channel layer 204, barrier layer 208 overlying channel layer 204, drain electrode 220, source electrode 230, gate 240 having gate electrode 242, and 2DEG 206. As further shown in FIG. 2, HEMT 200 also includes semiconductive field plate 246 formed on and adjoining surface 219 of barrier layer 208. Device structures including a semiconductive field plate corresponding to semiconductive field plate 246 are disclosed by U.S. Patent Application Publication Number 2012/0280363 A1 and U.S. Patent Application Publication Number 2013/0126942 A1. Additional disclosure directed to use of a semiconductive field plate formed on and adjoining a HEMT barrier layer by PowDec Technologies, Inc. may be found online at the following URLs (Note: URLs correct as of Oct. 21, 2014).

http://www.powdec.co.jp/news/file/Powdec-20131003e.pdf and at:

http://www.digitimes.com/supply_chain_window/story.asp?datepublish=2011/03/28&pages=PR&seq=201&query=POWDEC The use of such semiconductive field plates allows for the control of the field plate resistivity. This in turn allows for the use of a field plate which can support a substantial electric field and, through the use of acceptable leakage currents, effectively provides a uniform electric field across the field plate, between, e.g., the gate and drain electrodes. Adequate leakage current is required to allow for rapid equilibration of the electric fields during transient operation of the device, whereas it is preferable to maintain a leakage current which does not severely degrade the $I_{ON}$ to $I_{OFF}$ performance ratio of the device. This then sets an optimal range of leakage current or, more directly, resistivity of the thin film forming the semiconducting field plate.

Although the conventional field plate implementations described above can improve resistance to voltage breakdown in many applications, new solutions providing reduced peak electric fields for improved transistor breakdown capability and robust, long term reliability in higher voltage applications are needed. The present application is directed to group III-V transistors with a semiconductor field plate configured to meet this need. According to various implementations of the present inventive concepts, a thin semiconductor layer forms a distributed resistor which acts to evenly distribute the electric field across the device structure, especially between the gate and the drain electrode. As a result, the semiconductor field plate implementations disclosed herein to advantageously inhibit the formation of electric field peaks which are common in conventional field plate structures and typically occur at the edges or stepped discontinuities of the various conventional field plates.

Figure 3:
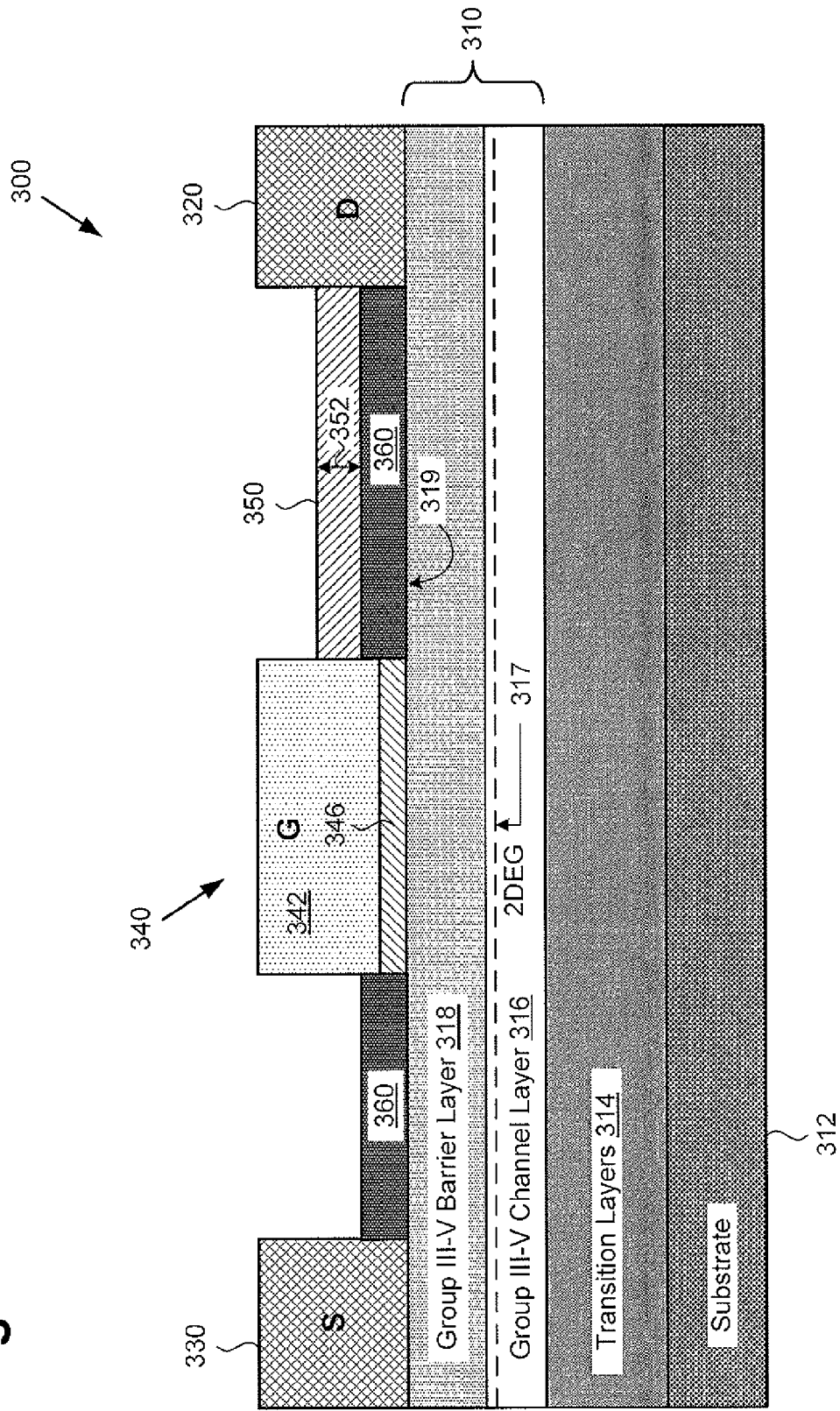
FIG. 3 shows a cross-sectional view of an exemplary group III-V HEMT with a semiconductor field plate, according to one implementation.

Referring to FIG. 3, FIG. 3 shows a cross-sectional view of exemplary group III-V HEMT 300 with semiconductor field plate 350 having thickness 352 situated over insulator layer 360 and configured to overcome the drawbacks and deficiencies associated with conventional field plate implementations. In addition to semiconductor field plate 350 and insulator layer 360, HEMT 300 includes group III-V heterostructure 310 and transition layers 314 situated over substrate 312. HEMT 300 also includes drain electrode 320 and source electrode 330 situated over surface 319 of group III-V heterostructure 310. HEMT 300 further includes gate 340 situated between drain electrode 320 and source electrode 330, and including gate electrode 342 formed over gate dielectric 346.

As shown in FIG. 3, group III-V heterostructure 310 includes group III-V channel layer 316 and group III-V barrier layer 318 overlying group III-V channel layer 316. As further shown in FIG. 3, group III-V heterostructure 310 is configured to produce 2DEG 317. It is noted that although gate 340 is shown as an insulated gate including gate dielectric 346 situated between gate electrode 342 and surface 319 of group III-V heterostructure 310, in other implementations, gate dielectric 346 may be omitted, and gate 340 may be implemented as a Schottky gate making Schottky contact with surface 319 of group III-V heterostructure 310.

It is further noted that although the transistor depicted in FIG. 3 is shown as HEMT 300, in other implementations, HEMT 300 may correspond to other types of power transistors. For example, in other implementations, HEMT 300 may correspond to a high voltage (14V) transistor, as described above in the "Definitions" section, implemented as an insulated-gate field-effect transistor (IGFET), or as an HV metal-insulator-semiconductor FET (MISFET), such as a metal-oxide-semiconductor FET (MOSFET).

Substrate 312 may be formed of any commonly utilized substrate material. For example, substrate 312 may be formed of sapphire, may be a native group III-V substrate, or may be a group IV substrate as described above in the "Definitions" section. In implementations in which substrate 312 is a native group III-V substrate, transition layers 314 may be omitted. However, when present, transition layers 314 may include multiple group III-V layers. According to one implementation, transition layers 314 may also include a strain-absorbing layer formed over substrate 312. Such a strain-absorbing layer may be an amorphous strain-absorbing layer, for example, an amorphous silicon nitride layer. It is noted that in implementations in which substrate 312 is a non-native substrate for group III-V channel layer 316 and group III-V barrier layer 318 (i.e., a non group III-V substrate, such as a silicon or other group IV substrate), transition layers 314 are provided to mediate the transition in lattice properties from substrate 312 to group III-V channel layer 316.

In one implementation, transition layers 314 may include a nucleation layer (nucleation layer not shown in FIG. 3), in addition to layers formed so as to reduce the net mismatch in thermal coefficient of expansion between substrate 312 and later formed to group III-V active layers, such as group III-V channel layer 316 and group III-V barrier layer 318. For instance, when forming a gallium nitride (GaN) based HEMT, transition layers 314 may include an aluminum nitride (AlN) layer formed on substrate 312, or on a stress reducing layer and/or a nucleation layer formed on substrate 312, and may further include a series of intermediate layers, such as AlGaN layers having a progressively reduced aluminum content relative to their gallium content, until a suitable transition to a GaN buffer layer included in transition layers 314 is achieved (buffer layer also not shown in FIG. 3. Examples of using such intermediate layers are disclosed in U.S. patent application Ser. No. 13/405,180, entitled "III-Nitride Semiconductor Structures with Strain Absorbing Interlayer Transition Modules", filed on Feb. 24, 2012, and published as U.S. Patent Application Publication Number 2012/0223365 on Sep. 6, 2012. This patent application is hereby incorporated fully by reference into the present application.

In some implementations, transition layers 314 may include compositionally graded III-Nitride or other group III-V materials. In such implementations, the specific compositions and thicknesses of transition layers 314 may depend on the diameter and thickness of substrate 312, and the desired performance of HEMT 300. For example, the desired breakdown voltage of HEMT 300, as well as the desired bow and warp of the associated epitaxial wafer supporting fabrication of HEMT 300 can influence the compositions and thicknesses of transition layers 314, as known in the art. For instance, when forming a GaN based HEMT, transition layers 314 may include an aluminum nitride (AlN) layer formed on substrate 312, or on a stress reducing layer and/or a nucleation layer formed on substrate 312, and may further include a series of AlGaN layers having a progressively reduced aluminum content relative to their gallium content, until a suitable transition to channel layer 316 is achieved. Moreover, in some implementations, transition layers 314 may take the form of a compositionally graded body having different group III-V alloy compositions at respective top and bottom surfaces.

Examples of using compositionally graded transition layers, as well as use of intermediate layers, stress reducing layers, and various interlayers are disclosed in U.S. Pat. No. 6,649,287, entitled "Gallium Nitride Materials and Methods", filed on Dec. 14, 2000, and issued on Nov. 18, 2003; U.S. Pat. No. 6,617,060, also entitled "Gallium Nitride Materials and Methods", filed on Jul. 2, 2002, and issued on Sep. 9, 2003; U.S. Pat. No. 7,339,205, entitled "Gallium Nitride Materials and Methods Associated with the Same", filed on Jun. 28, 2004, and issued on Mar. 4, 2008; U.S. Pat. No. 8,344,417, entitled "Gallium Nitride Semiconductor Structures with Compositionally-Graded Transition Layer", filed on Jan. 27, 2012, and issued on Jan. 1, 2013; U.S. Pat. No. 8,592,862, also entitled "Gallium Nitride Semiconductor Structures with Compositionally-Graded Transition Layer", filed on Dec. 27, 2012, and issued on Nov. 26, 2013; U.S. Pat. No. 8,659,030, entitled "III-Nitride Heterojunction Devices Having a Multilayer Spacer", filed on Feb. 15, 2012, and issued on Feb. 25, 2014; U.S. patent application Ser. No. 12/928,946, entitled "Stress Modulated Group III-V Semiconductor Device and Related Method", filed on Dec. 21, 2010, and published as U.S. Patent Application Publication Number 2012/0153351 on Jun. 21, 2012; U.S. patent application Ser. No. 11/531,508, entitled "Process for Manufacture of Super Lattice Using Alternating High and Low Temperature Layers to Block Parasitic Current Path", filed on Sep. 13, 2006, and published as U.S. Patent Application Publication Number 2007/0056506 on Mar. 15, 2007; and U.S. patent application Ser. No. 13/405,180, entitled "III-Nitride Semiconductor Structures with Strain Absorbing Interlayer Transition Modules", filed on. Feb. 24, 2012 and published as U.S. Patent Application Publication Number 2012/0223365 on Sep. 6, 2012. The above-referenced patents and patent applications are hereby incorporated fully by reference into the present application.

As shown in FIG. 3, group III-V channel layer 316 is formed over transition layers 314, and group III-V barrier layer 318 is formed over group III-V channel layer 316. In addition a thin group III-V capping layer may be used over group III-V barrier layer 318 (capping layer not shown). In one implementation, for example, a HEMT 300 may take the form of a III-Nitride HEMT having a GaN layer as group III-V channel layer 316 and an AlGaN layer as group III-V barrier layer 318. It is noted that the optional capping layer described above may be formed of GaN or AlGaN and may be intentionally doped or may be substantially undoped.

It is further noted that in certain applications, it may be desirable to form group III-V barrier layer 318 over a spacer layer (or layers) disposed between group III-V barrier layer 318 and group III-V channel layer 316. Examples of using such spacer layer(s) are disclosed in U.S. Pat. No. 8,659,030, entitled "III-Nitride Heterojunction Devices Having a Multilayer Spacer", filed on Feb. 15, 2012, and issued on Feb. 25, 2014. This patent is hereby incorporated fully by reference into the present application.

Drain electrode 320 and source electrode 330 are situated over group III-V barrier layer 318 such that they make ohmic contact with 2DEG 317. Gate electrode 342 may be implemented as a conductive polysilicon electrode, or as a metal electrode, for example. Gate dielectric 346 may be formed of any suitable gate dielectric material, such as silicon dioxide ($SiO_2$), aluminum oxide ($Al_2O_3$) or silicon nitride ($Si_3N_4$), for example.

Also shown in FIG. 3 is semiconductor field plate 350 situated between gate 340 and drain electrode 320 and adjoining each of gate 340 and drain electrode 320. It is noted, that as used herein, two objects are said to "adjoin" when they are in direct contact with one another. Thus, when semiconductor field plate 350 is described as adjoining each of gate 340 and a drain electrode 320, semiconductor field plate 350 is situated so as to be in direct contact with gate 340, as well as to be in direct contact with drain electrode 320.

Semiconductor field plate 350 may be implemented as a thin semiconductor layer, such as a semiconductor layer having thickness 352 in a range from approximately ten nanometers to approximately one micrometer (approximately 10.0 nm to approximately 1.0 µm), such as thickness 352 of approximately 100 nm, for example. Semiconductor field plate 350 may be configured to have a sheet resistance in a range from approximately $10^4$ ohms/square to approximately $10^7$ ohms/square. In one implementation, semiconductor field plate 350 is formed such that the leakage current expected through HEMT 300 between drain and source without the semiconductor field plate is greater than or approximately equal to the the leakage current through semiconductor field plate 350. As a result, it may be advantageous or desirable to configure semiconductor field plate 350 so as to have a leakage of for example, less than approximately one microampere per millimeter of gate width (1.0 µA per mm of gate width) so that it does not add significantly to the total leakage current of HEMT 300.

Semiconductor field plate 350 may be formed as an amorphous semiconductor layer, or as a single crystalline or polycrystalline semiconductor layer. For example, in some implementations, semiconductor field plate 350 may be formed as a single crystalline or polycrystalline or amorphous III-Nitride layer (e.g., GaN, or AlGaN). For instance, in one implementation semiconductor field plate 350 may be formed of AlGaN having an aluminum concentration of from approximately four percent to approximately thirty percent (approximately 4% to approximately 30%). In such an implementation, the AlGaN may be doped with Si or magnesium (Mg), or any commonly utilized III-Nitride dopants, to achieve a desirable sheet resistance of semiconductor field plate 350. However, it is emphasized that the semiconductor material used to form semiconductor field plate 350 need not be single crystalline, and in some implementations, it may be advantageous or desirable for semiconductor field plate 350 to have a polycrystalline or amorphous crystal structure.

Semiconductor field plate 350 functions as a distributed resistor and acts to evenly distribute the electric field between gate 340 and drain electrode 320 of HEMT 300. As a result, semiconductor field plate 350 advantageously inhibits the formation of electric field peaks, which are common in conventional field plate implementations. It is noted that in some implementations, in addition to semiconductor field plate 350, HEMT 300 may also include a conductive field plate (conductive field plate not shown in FIG. 3) connected to drain electrode 320 and/or gate 340.

As further shown in FIG. 3, HEMT 300 includes insulator layer 360 situated between semiconductor field plate 350 and group III-V heterostructure 310. The presence of insulating layer 360 between semiconductor field plate 350 and surface 319 of group III-V heterostructure 310 may confer several benefits for device performance and stability. For example, insulating layer 360 may provide improved passivation of group III-V barrier layer 318 (or a capping layer over group III-V barrier layer 318), which in turn may help to stabilize device performance during high applied field stress conditions. Moreover, insulating layer 360 naturally helps to reduce the maximum electric field present across the films situated between 2DEG 317 and/or drain electrode 320 and the combination of gate electrode 342 and semiconductor field plate 350, for example. As a result, the fields present at surface 319 are reduced, further contributing to device stability under high field stress conditions.

Figure 4:
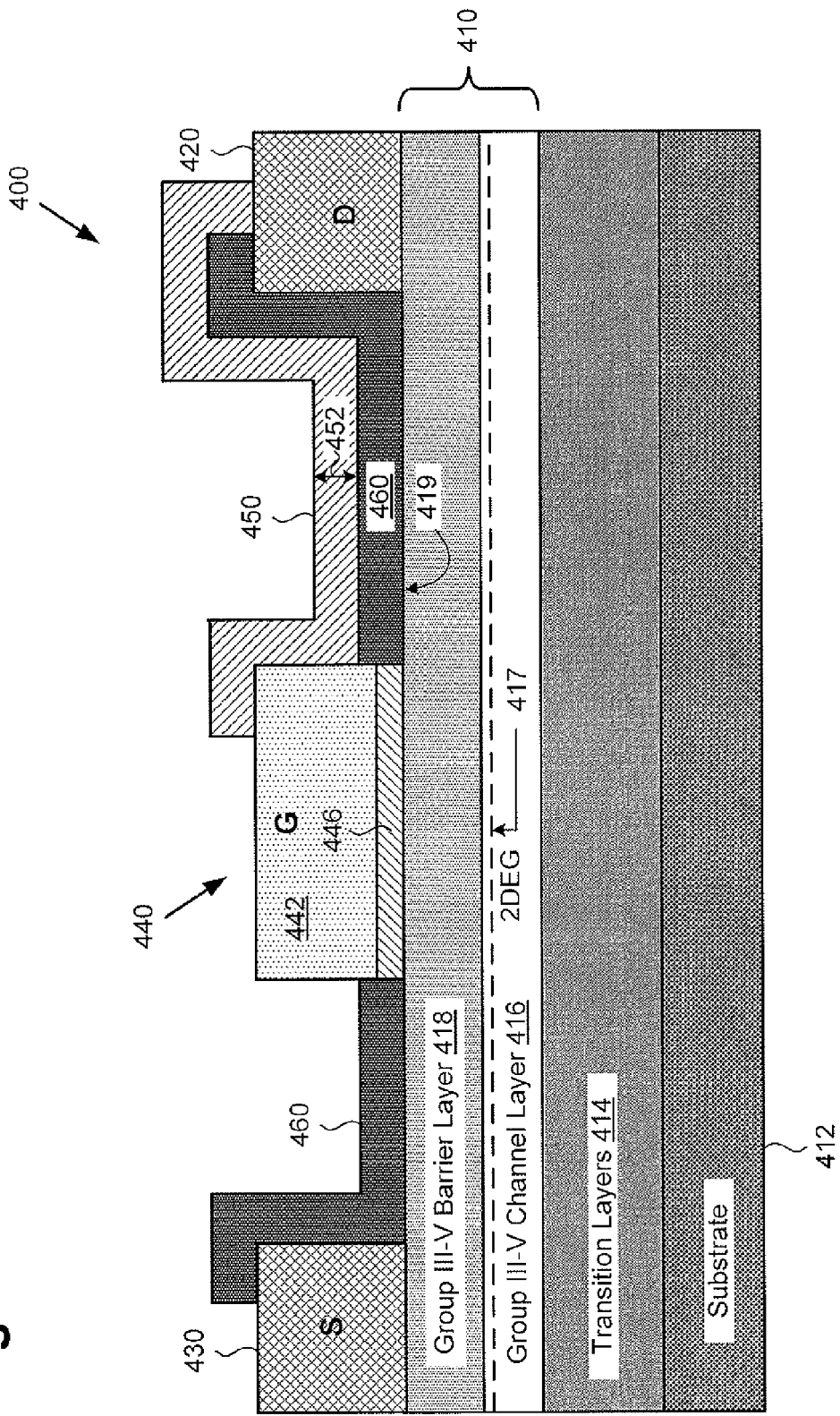
FIG. 4 shows a cross-sectional view of an exemplary group III-V HEMT with a semiconductor field plate, according to another implementation.

Moving to FIG. 4, FIG. 4 shows a cross-sectional view of exemplary group III-V HEMT 400 with semiconductor field plate 450 having thickness 452, according to another implementation. As shown in FIG. 4, in addition to semiconductor field plate 450, HEMT 400 includes drain electrode 420 and source electrode 430 situated over surface 419 of group III-V heterostructure 410. HEMT 400 also includes gate 440 situated between drain electrode 420 and source electrode 430, and including gate electrode 542 formed over gate dielectric 546.

HEMT 400 further includes group III-V channel layer 416 and group III-V barrier layer 418 of group III-V heterostructure 410, transition layers 414, and substrate 412. Also shown in FIG. 4 are insulator layer 460, and 2DEG 417 produced by group III-V channel layer 416 and group III-V barrier layer 418.

HEMT 400 including group III-V heterostructure 410, drain electrode 420, source electrode 430, gate 440, and semiconductor field plate 450 having thickness 452 corresponds in general to HEMT 300 including group III-V heterostructure 310, drain electrode 320, source electrode 330, gate 340, and semiconductor field plate 350 having thickness 342, in FIG. 3. As a result, group III-V heterostructure 410, drain electrode 420, source electrode 430, gate 440, and semiconductor field plate 450 having thickness 452 may share any of the characteristics attributed respectively to group III-V heterostructure 310, drain electrode 320, source electrode 330, gate 340, and semiconductor field plate 350 having thickness 352, by reference to the implementation shown in FIG. 3 and described above.

As further shown in FIG. 4, HEMT 400 also includes insulator layer 460 situated between semiconductor field plate 450 and surface 419 of group III-V heterostructure 410. For example, according to the implementation shown in FIG. 4, insulator layer 460 is situated between semiconductor field plate 450 and group barrier layer 418. In contrast to the implementation shown in FIG. 3, however, in HEMT 400, insulator layer 460 may be disposed at least partially over drain electrode 420. Nevertheless, insulator layer 460 corresponds in general to insulator layer 360, in FIG. 3, and may share any of the characteristics attributed to that corresponding feature above. It is noted that in other implementations, in addition to semiconductor field plate 450 and insulator layer 460, HEMT 400 may also include a conductive field plate (conductive field plate not shown in FIG. 4) connected to drain electrode 420 and/or gate 440.

Thus, the present application discloses a group III-V transistor with semiconductor field plate. According to various implementations of the present inventive concepts, a semiconductor field plate can be used to form a distributed resistor which acts to evenly distribute the electric field across the transistor structure, between the gate and the drain electrode. As a result, the semiconductor field plate disclosed herein advantageously inhibits the formation of electric field peaks which are common in conventional field plate structures.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A group III-V transistor comprising:
a group III-V heterostructure situated over a substrate and configured to produce a two-dimensional electron gas (2DEG);
a source electrode, a drain electrode, and a gate situated over said group III-V heterostructure;
an insulator layer over said group III-V heterostructure and situated between said gate and said drain electrode,
wherein a gate-facing end of said insulator layer is in contact with, and terminates at, a side surface of said gate,
wherein a drain electrode-facing end of said insulator layer is in contact with a side surface, and a portion of an upper surface, of said drain electrode;
a semiconductor field plate situated between said gate and said drain electrode, over said insulator layer,
wherein a gate-facing end of said semiconductor field plate is in contact with said side surface, and a portion of an upper surface, of said gate,
wherein a drain electrode-facing end of said semiconductor field plate is in contact with a portion of the upper surface of said drain electrode;
wherein said semiconductor field plate adjoins said drain electrode.

2. The group III-V transistor of claim 1, wherein said semiconductor field plate has a sheet resistance in a range from approximately $10^4$ ohms/square to approximately $10^7$ ohms/square.

3. The group III-V transistor of claim 1, wherein said semiconductor field plate comprises an amorphous semiconductor layer.

4. The group III-V transistor of claim 1, wherein said semiconductor field plate comprises a single crystalline semiconductor layer.

5. The group III-V transistor of claim 1, wherein said semiconductor field plate comprises a polycrystalline semiconductor layer.

6. The group III-V transistor of claim 1, wherein said semiconductor field plate comprises a polycrystalline III-Nitride layer.

7. The group III-V transistor of claim 1, wherein said semiconductor field plate comprises an amorphous III-Nitride layer.

8. A III-Nitride transistor comprising:
a gallium nitride (GaN) channel layer situated over a substrate;
an aluminum gallium nitride (AlGaN) barrier layer situated over said GaN channel layer, said AlGaN barrier layer and said GaN channel layer configured to produce a two-dimensional electron gas (2DEG);
a source electrode, a drain electrode, and a gate situated over said AlGaN barrier layer;
an insulator layer over said AlGaN barrier layer and situated between said gate and said drain electrode,
wherein a gate-facing end of said insulator layer is in contact with, and terminates at, a side surface of said gate,
wherein a drain electrode-facing end of said insulator layer is in contact with a side surface, and a portion of an upper surface, of said drain electrode;
a semiconductor field plate situated between said gate and said drain electrode, over said insulator layer,
wherein a gate-facing end of said semiconductor field plate is in contact with said side surface, and a portion of an upper surface, of said gate,
wherein a drain electrode-facing end of said semiconductor field plate is in contact with a portion of the upper surface of said drain electrode;
wherein said semiconductor field plate adjoins said drain electrode.

9. The III-Nitride transistor of claim 8, wherein said semiconductor field plate has a sheet resistance in a range from approximately $10^4$ ohms/square to approximately $10^7$ ohms/square.

10. The Ill-Nitride transistor of claim 8, wherein said semiconductor field plate comprises an amorphous semiconductor layer.

11. The III-Nitride transistor of claim 8, wherein said semiconductor field plate comprises a single crystalline III-Nitride layer.

12. The III-Nitride transistor of claim 8, wherein said semiconductor field plate comprises a polycrystalline III-Nitride layer.

* * * * *